(12) United States Patent
Masaki et al.

(10) Patent No.: US 12,550,674 B2
(45) Date of Patent: Feb. 10, 2026

(54) METHOD FOR MANUFACTURING SEMICONDUCTOR ELEMENT, SEMICONDUCTOR ELEMENT BODY, AND SEMICONDUCTOR ELEMENT SUBSTRATE

(71) Applicant: KYOCERA Corporation, Kyoto (JP)

(72) Inventors: Katsuaki Masaki, Kyoto (JP); Masahiro Araki, Yokkaichi (JP)

(73) Assignee: KYOCERA Corporation, Kyoto (JP)

( * ) Notice: Subject to any disclaimer, the term of this patent is extended or adjusted under 35 U.S.C. 154(b) by 689 days.

(21) Appl. No.: 17/915,335

(22) PCT Filed: Mar. 29, 2021

(86) PCT No.: PCT/JP2021/013321
§ 371 (c)(1),
(2) Date: Sep. 28, 2022

(87) PCT Pub. No.: WO2021/200832
PCT Pub. Date: Oct. 7, 2021

(65) Prior Publication Data
US 2023/0140914 A1    May 11, 2023

(30) Foreign Application Priority Data

Mar. 30, 2020 (JP) .................. 2020-060814

(51) Int. Cl.
*H01L 21/683* (2006.01)
*H01L 25/16* (2023.01)
(Continued)

(52) U.S. Cl.
CPC ........ *H01L 21/6835* (2013.01); *H01L 25/167* (2013.01); *H10H 20/857* (2025.01);
(Continued)

(58) Field of Classification Search
CPC ............... H01L 21/6835; H01L 25/167; H01L 2221/68354; H01L 2221/68363;
(Continued)

(56) References Cited

U.S. PATENT DOCUMENTS

| | | | |
|---|---|---|---|
| 6,613,610 B2* | 9/2003 | Iwafuchi | H01L 21/6835 438/464 |
| 7,208,393 B2* | 4/2007 | Haskell | H01L 21/02378 438/479 |
| 7,291,509 B2* | 11/2007 | Hahn | H10H 20/01335 438/33 |
| 8,236,583 B2* | 8/2012 | Chen | C23C 14/048 438/23 |
| 8,780,561 B2* | 7/2014 | Danello | H01L 23/433 29/841 |

(Continued)

FOREIGN PATENT DOCUMENTS

| | | |
|---|---|---|
| JP | 2003-158296 A | 5/2003 |
| JP | 2011-066390 | 3/2011 |
| JP | 2013-251304 A | 12/2013 |

*Primary Examiner* — Vu A Vu
(74) *Attorney, Agent, or Firm* — Volpe Koenig

(57) ABSTRACT

A method of manufacturing a semiconductor element includes: forming a first semiconductor layer (SL1) and a second semiconductor layer (SL2) larger in thickness than the first semiconductor layer (SL1) on a mask layer (ML) including a first opening portion (K1) and a second opening portion (K2); forming a first device layer (DL1) and a second device layer (DL2); and bonding the first device layer (DL1) and the second device layer (DL2) to a support substrate (SK).

15 Claims, 17 Drawing Sheets

(51) Int. Cl.
*H10H 20/857* (2025.01)
*H10H 20/01* (2025.01)

(52) U.S. Cl.
CPC ............... *H01L 2221/68354* (2013.01); *H01L 2221/68363* (2013.01); *H10H 20/0364* (2025.01)

(58) Field of Classification Search
CPC .......... H01L 2221/68381; H01L 21/02; H10H 20/857; H10H 20/0364; H10H 20/825; H10H 20/817; H10H 20/819; H10H 20/0137; C30B 25/18; C30B 29/38
USPC ......................................................... 257/99
See application file for complete search history.

(56) References Cited

U.S. PATENT DOCUMENTS

| | | | |
|---|---|---|---|
| 8,791,473 B2* | 7/2014 | Yokogawa | H01L 25/0753 |
| | | | 257/89 |
| 10,224,315 B2* | 3/2019 | Chen | H10H 20/857 |
| 11,037,857 B1* | 6/2021 | Wang | H01L 24/32 |
| 11,152,540 B2* | 10/2021 | Kuo | H10H 20/84 |
| 11,574,889 B2* | 2/2023 | Geitner | H01L 23/3107 |
| 2010/0261300 A1* | 10/2010 | Tu | H10H 20/018 |
| | | | 257/E21.09 |
| 2012/0280363 A1 | 11/2012 | Sumida et al. | |
| 2016/0013275 A1* | 1/2016 | Hwang | H01L 21/02639 |
| | | | 257/615 |

* cited by examiner

METHOD FOR MANUFACTURING SEMICONDUCTOR ELEMENT, SEMICONDUCTOR ELEMENT BODY, AND SEMICONDUCTOR ELEMENT SUBSTRATE

TECHNICAL FIELD

The present disclosure relates to a method for manufacturing a semiconductor element, a semiconductor element body, and a semiconductor element substrate.

BACKGROUND OF INVENTION

In a known technique, after a growth mask including a plurality of openings is formed on a GaN substrate, a plurality of island-shaped GaN-based semiconductor layers grown from the GaN substrate and extending on the growth mask are formed, and then the GaN-based semiconductor layers are peeled from the GaN substrate (e.g., see Patent Document 1 below).

Patent Document 1 discloses a technique of providing a spacer at the outer periphery of a bonding surface when GaN semiconductor layers, which are formed by epitaxial lateral overgrowth (ELO) of an underlying substrate, and a support substrate are bonded together.

CITATION LIST

Patent Literature

Patent Document 1: JP 2013-251304 A

SUMMARY

In the present disclosure, a method for manufacturing a semiconductor device includes: forming a mask layer on an underlying substrate, the mask layer including a first mask portion in which two opening portions adjacent to each other are located spaced apart by a predetermined first interval and a second mask portion in which two opening portions adjacent to each other are located spaced apart by a predetermined second interval larger than the first interval; forming a semiconductor element by growing a semiconductor layer on the mask layer; preparing a support substrate including a bonding surface, the bonding surface facing the underlying substrate; bonding together an upper surface of the semiconductor element and the bonding surface of the support substrate; and peeling the semiconductor element formed on the mask layer from the underlying substrate.

In the present disclosure, a semiconductor element body includes: a first semiconductor element layer formed on a growth surface of an underlying substrate and having a predetermined first height dimension in a direction perpendicular to the growth surface; a second semiconductor element layer formed on the growth surface of the underlying substrate and having a predetermined second height dimension higher than the first height dimension; and a support substrate including a bonding surface bonded to an upper surface of the second semiconductor element layer.

DESCRIPTION OF EMBODIMENTS

Embodiments of the present disclosure will be described below with reference to each drawing schematically illustrated.

Figure 3:
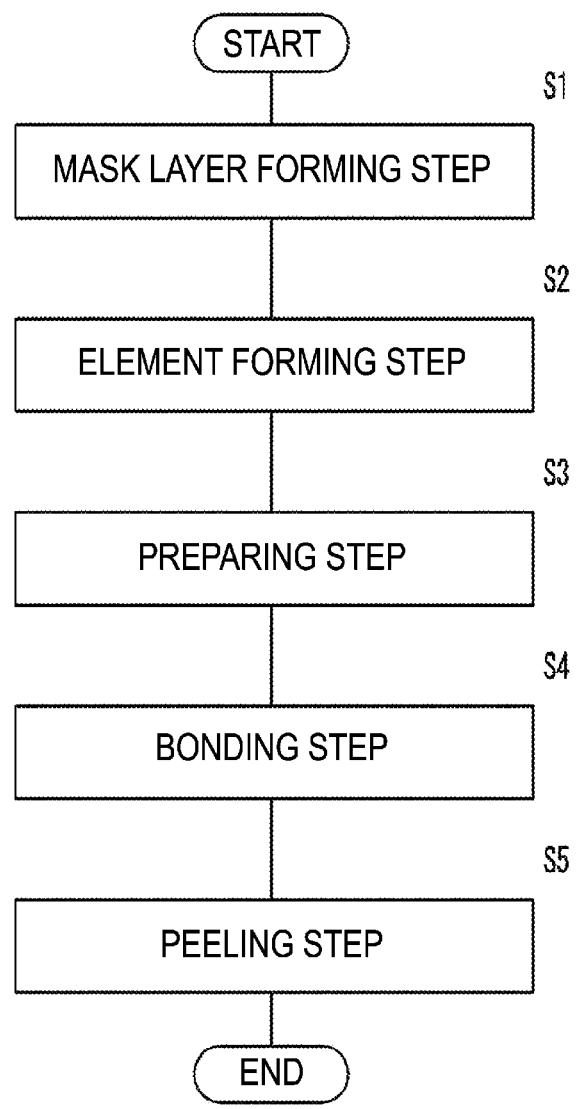
FIG. 3 is a process diagram for describing basic manufacturing procedures of a method for manufacturing a semiconductor element.

As illustrated in FIG. 3, a semiconductor element of the present embodiment can be manufactured through steps including, for example, a mask layer forming step S1, an element forming step S2, a preparing step S3, a bonding step S4, and a peeling step S5. However, the element forming step S2 and the preparing step S3 need not be performed in this order. For example, the element forming step S2 and the preparing step S3 may be performed in parallel.

Figure 1:
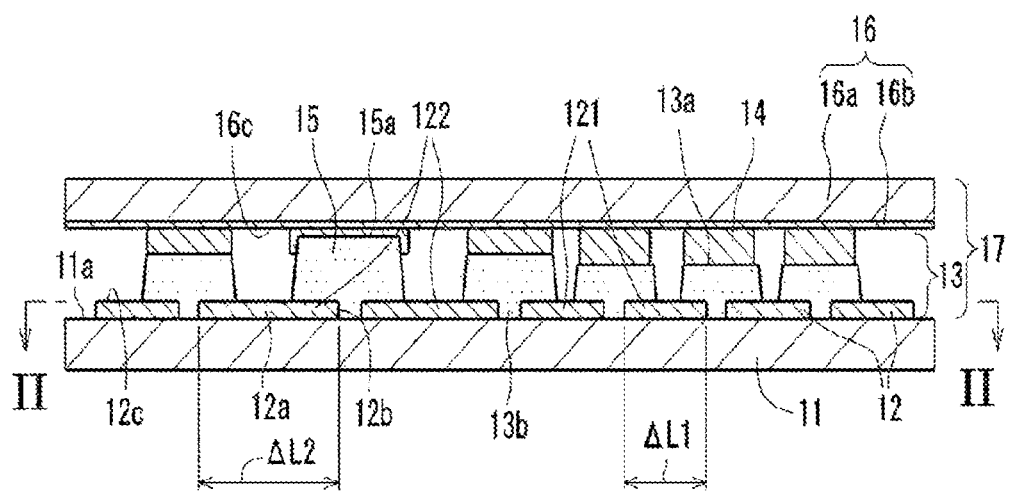
FIG. 1 is a cross-sectional view illustrating a configuration of a semiconductor element body according to a first embodiment of the present disclosure.
Figure 2:
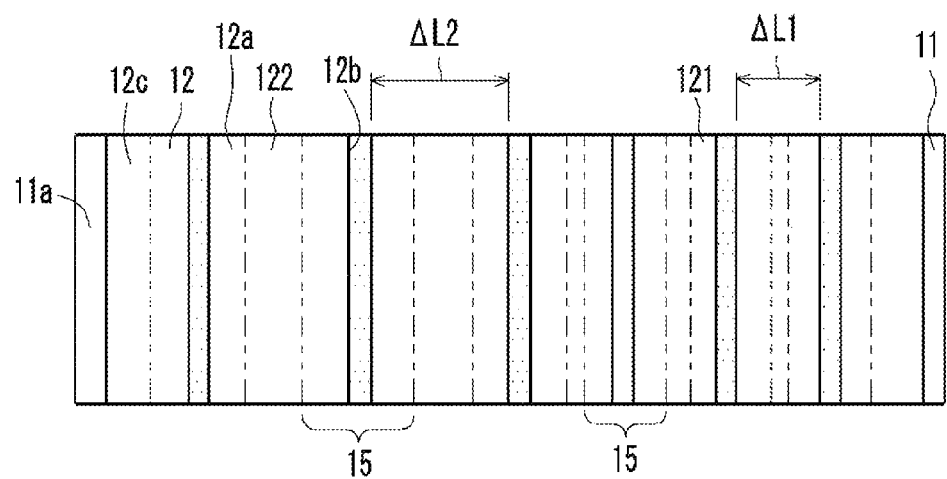
FIG. 2 is a cross-sectional view illustrating a portion of the semiconductor element body as viewed from a cross-sectional plane line II-II in FIG. 1.

Hereinafter, description will be given with reference to FIGS. 1 to 3.

In the mask layer forming step S1, a mask 12 is formed. The mask 12 includes first mask portions 121 and second mask portions 122. For the first mask portions 121, two opening portions 12b adjacent to each other are located spaced apart by a predetermined first interval ΔL1 on an underlying substrate 11. For the second mask portions 122, two opening portions adjacent to each other are located spaced apart by a predetermined second interval ΔL2 larger than the first interval ΔL1.

In the element forming step S2, a semiconductor element layer 13, which is a crystal growth layer of a semiconductor crystal, is vapor phase grown on growth surfaces 11a exposed from the opening portions 12b. The semiconductor element layer 13 of the present disclosure is a nitride semiconductor layer. The semiconductor element layer 13 includes connecting portions 13b, each of which is connected to a corresponding one of the growth surfaces 11a exposed from the opening portions 12b of the mask layer 12. A semiconductor layer is grown on the mask layer 12 to form semiconductor elements 15.

In the preparing step S3, a support substrate 16 including a bonding surface 16c to be placed on the underlying substrate 11 side is prepared. In the bonding step S4, the upper surfaces 15a of the semiconductor elements 15 and the bonding surface 16c of the support substrate 16 are bonded together. In the peeling step S5, the semiconductor elements 15 formed on the mask layer 12 are peeled from the underlying substrate 11.

First Embodiment

Figure 4A:
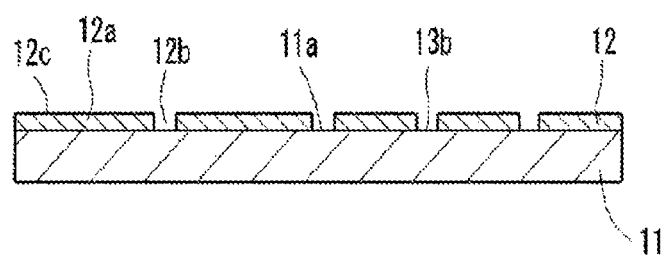
FIGS. 4A to 4C are each a cross-sectional view illustrating an element forming step according to the first embodiment.

FIG. 4 is a cross-sectional view illustrating an element forming step according to a first embodiment. As illustrated in FIG. 4A, the underlying substrate 11 is prepared. As the underlying substrate 11, for example, a GaN template substrate can be used. The underlying substrate 11 is an off-angle substrate. The normal lines of the growth surfaces 11a of the underlying substrate 11 are inclined by 0.3° from the a-axis <11-20> direction. While the off angle relative to the a-axis is 0.3° in the present embodiment, a substrate having an off angle of from 0.1° to 1° can be used. However, the upper limit value for the off angle is a value selected as appropriate depending on the device as long as flat growth is achieved. Thus, the upper limit value of the off angle is not necessarily 1°, and may be set exceeding 1°. An off angle of less than 0.1° may make it impossible to peel the ELO semiconductor layer, and thus an off angle of 0.1° or greater is advantageous. The upper limit value for the off angle of 1° is a standard off angle for LED substrates.

As such an underlying substrate 11, for example, a GaN substrate cut out from a GaN single crystal ingot can be used such that the growth surfaces 11a of the underlying substrate 11 are in a predetermined plane direction. As the underlying substrate 11, any nitride semiconductor substrate may be used. Alternatively, an n-type substrate or a p-type substrate in which the nitride semiconductor is doped with impurities may be used.

Here, the "nitride semiconductor" may be constituted by, for example, $Al_xGa_yIn_zN$ ($0 \leq x \leq 1$; $0 \leq y \leq 1$; $0 \leq z \leq 1$; $x+y+z=1$). As the GaN template substrate, for example, sapphire, Si, or SiC can be used as a foundation.

The mask layer 12 is formed on the underlying substrate 11. The material of the mask layer 12 may be, for example, a silicon oxide (e.g., such as $SiO_2$), a silicon nitride ($SiN_x$), or a high-melting-point metal (such as Ti or W). The mask layer 12 may be formed by, for example, a plasma chemical vapor deposition (PCVD) method or the like. In the present disclosure, for example, an $SiO_2$ layer of approximately 100 nm is layered on the growth surfaces 11a. For example, the $SiO_2$ layer is patterned by a photolithography method, wet etching with buffered hydrogen fluoride (BHF), and the like. As a result, the mask layer 12 illustrated in FIG. 4A is formed.

The mask layer 12 has a stripe shape in which a plurality of strip shape portions 12a that are long in the direction perpendicular to the paper surface are aligned in parallel at predetermined intervals. In the present disclosure, the width of the opening portion 12b between adjacent strip shape portions 12a is, for example, approximately 5 μm. The width of each strip shape portion 12a is, for example, approximately 50 μm to 200 μm. The width of the opening portion 12b is, for example, approximately 2 μm to 20 μm.

As the material for forming the mask layer 12, apart from $SiO_2$, a material may be used that makes it difficult for a semiconductor layer to grow from the mask material by vapor phase growth. As the mask material, for example, an oxide, such as $ZrO_x$, $TiO_x$, or $AlO_x$, which can be patterned, or a transition metal, such as W or Cr can also be used. As the method for layering the mask 12, any method that is suitable for the mask material, such as vapor deposition, sputtering, or coating and curing, can be used as appropriate.

Figure 4B:
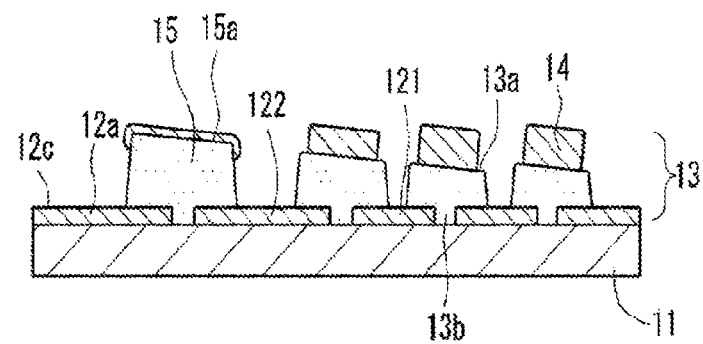

As illustrated in FIG. 4B, a semiconductor element layer 13, which is a crystal growth layer of a semiconductor crystal, is vapor phase grown on the growth surfaces 11a exposed from the opening portions 12b. The semiconductor element layer 13 of the present disclosure is a nitride semiconductor layer.

As a method of crystal growth, vapor phase epitaxy (VPE) by a chloride transport method using a chloride as a group III raw material, or metal organic chemical vapor deposition (MOCVD) using an organic metal as a group III raw material can be used. The ratio of a raw material gas of a group III element, the ratio of a raw material gas of an impurity, and the like can be varied during the growing step to form the semiconductor element layer 13 as a multi-layer film that functions as a light-emitting diode (LED) or a laser diode (LD).

When the grown crystal exceeds the opening portions 12b of the mask layer 12, the crystal is also laterally grown along the mask layer upper surface 12c. The crystal growth is completed before adjacent portions of the semiconductor element layer 13 grown from the growth surfaces 11a overlap with each other. In this manner, the semiconductor element layer 13, which is a nitride semiconductor grown by an epitaxial lateral overgrowth (ELO) method, is obtained. The width of the semiconductor element layer 13 is, for example, from approximately 50 μm to approximately 200 μm, and the height is from approximately 10 μm to approximately 50 μm.

Figure 5:
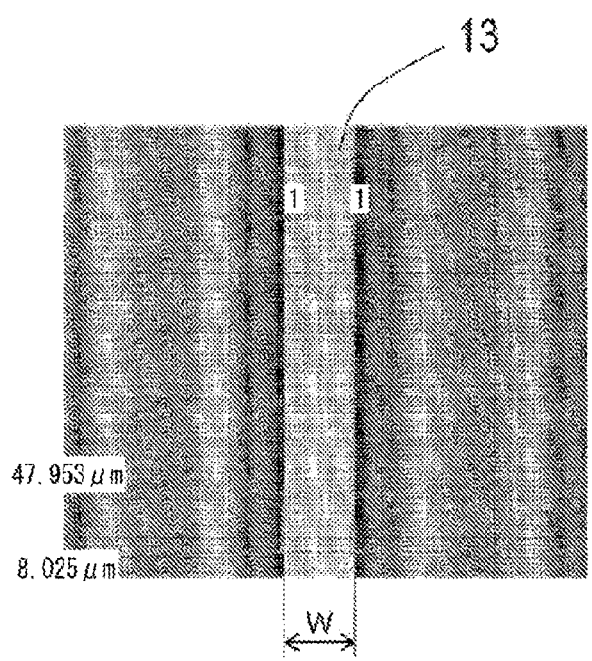
FIG. 5 is a photograph of a semiconductor element layer formed on an underlying substrate.
Figure 6:
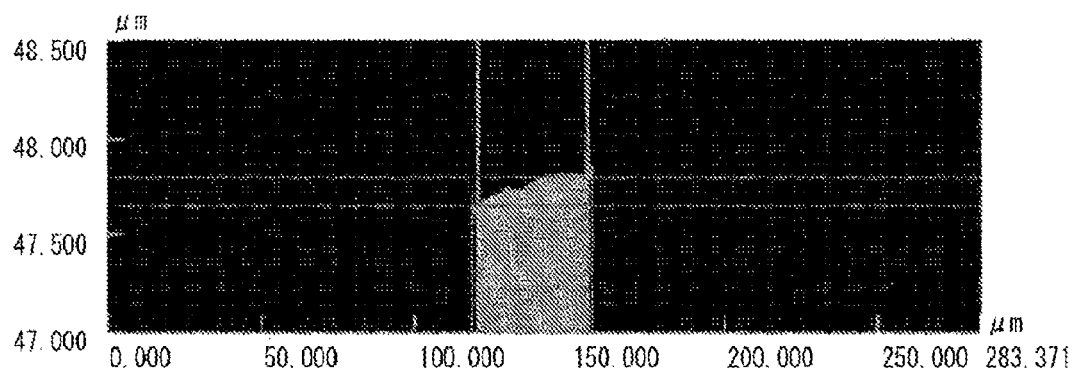
FIG. 6 is a graph showing an inclination of an upper surface of the semiconductor element layer.

FIG. 5 is a photograph showing a specific example of the semiconductor element layer 13 formed on the underlying substrate 11, and is a top view of the semiconductor element layer 13 formed on the mask layer 12 by the above-described method. FIG. 6 is a graph showing an inclination of the upper surface of the semiconductor element layer 13, and shows a measurement result of measuring a distance between the upper surface of the semiconductor element layer 13 illustrated in FIG. 1 and a reference surface.

The width W of the semiconductor element layer 13 formed in a strip shape is 35 μm. In the width direction, the right end side is higher than the left end side, and the height difference between both ends is 150 nm. The inclination angle of a first surface 13a (upper surface) of the semiconductor element layer 13 is 0.25°. The off angle of the underlying substrate 11 used in the growth of the semiconductor element layer 13 is 0.22°, and the inclination angle of the first surface 13a corresponds to the off angle of the underlying substrate 11.

Growing the semiconductor element layer 13 with an off angle added to the underlying substrate 11 in this manner is preferable for realizing a semiconductor element layer 13 having crystallinity of excellent quality. The semiconductor element layer 13 has the first surface 13a and a second surface 13c located on the opposite side to the first surface 13a.

After the semiconductor element layer 13 is grown, as illustrated in FIG. 4B, a metal layer 14 is formed on a first surface 13a of the semiconductor element layer 13. First, the entire upper surfaces of the underlying substrate 11, the mask layer 12, and the semiconductor element layer 13 are covered with a photoresist film. Thereafter, opening portions 12b are provided using a photolithography method such that the first surface 13a of the semiconductor element layer 13 is exposed. Thereafter, a Cr layer and a AuSn layer, which is an alloy of gold and tin, are vapor deposited in order at the opening portions 12b. Thereafter, any unnecessary metal layer is removed together with the photoresist film by a lift-off method to form the metal layer 14. The thickness of the metal layer 14 is approximately from 1 μm to 5 μm.

Figure 4C:
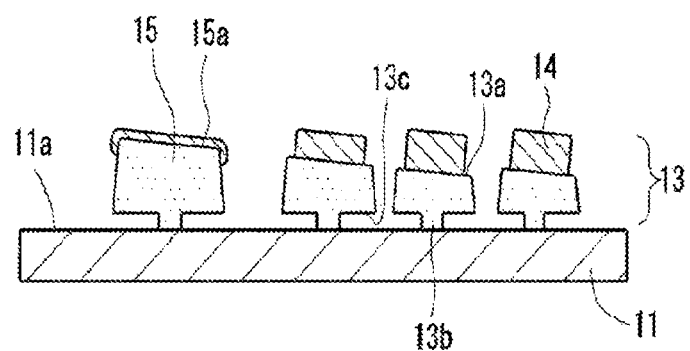

After the metal layer 14 is formed, the underlying substrate 11, the mask layer 12 formed on the underlying substrate 11, the semiconductor element layer 13, and the metal layer 14 are immersed in BHF for approximately 10 minutes to remove the mask layer 12. As a result, as illustrated in FIG. 4C, semiconductor elements 15 are formed on the underlying substrate 11. The semiconductor elements 15 and the underlying substrate 11 are connected to the underlying substrate 11 via connecting portions 13b, which are portions of the semiconductor element layer 13 grown at the opening portions 12b of the mask layer 12. The connecting portions 13b are, for example, of a columnar shape. The metal layer 14 can be used as an electrode of the semiconductor element 15.

However, depending on the configuration of the semiconductor elements 15, the metal layer 14 need not necessarily be used as an electrode. An upper surface 15a of the semiconductor element 15 is inclined similarly to the first surface 13a of the semiconductor element layer 13. The semiconductor element layer 13 has the first surface 13a and the second surface 13c located on the opposite side to the first surface 13a.

Figure 7:
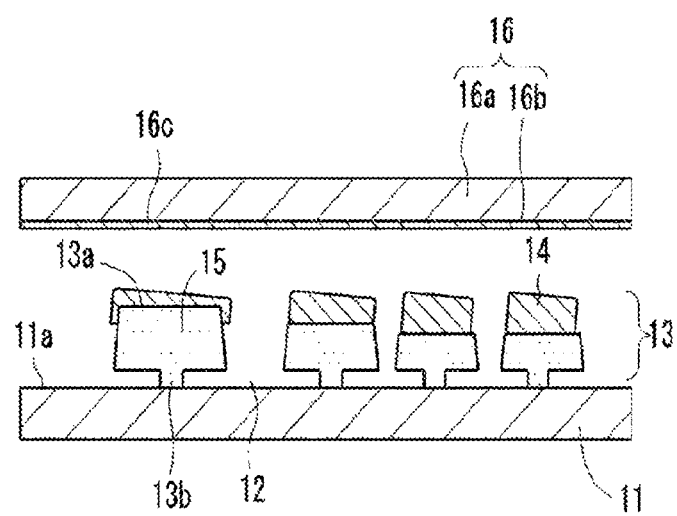
FIG. 7 is a cross-sectional view illustrating a preparing step according to the first embodiment.

FIG. 7 is a cross-sectional view illustrating a preparing step according to the first embodiment. Subsequently, a support substrate 16 for connecting to the semiconductor element 15 is prepared. In the support substrate 16, a silicon substrate is used as a base 16a. A metal layer 16b that is less likely to be oxidized, such as Au, is located on one surface of the base 16a. The surface facing the underlying substrate 11 of the metal layer 16b is the bonding surface 16c. The metal layer 16b facilitates bonding of the semiconductor element 15 to the support substrate 16. For the metal layer 16b, apart from Au, a precious metal material less likely to be oxidized such as Pt or Pd, or a material containing such a precious metal material as a main component can be used. However, the present disclosure is not limited thereto.

Subsequently, the semiconductor element 15 is connected to the support substrate 16 by using a substrate bonding apparatus (not illustrated). First, the underlying substrate 11 and the support substrate 16 are attached to the substrate bonding apparatus so that the growth surfaces 11a of the underlying substrate 11 and the bonding surface 16c of the support substrate 16 are parallel to each other.

Figure 8A:
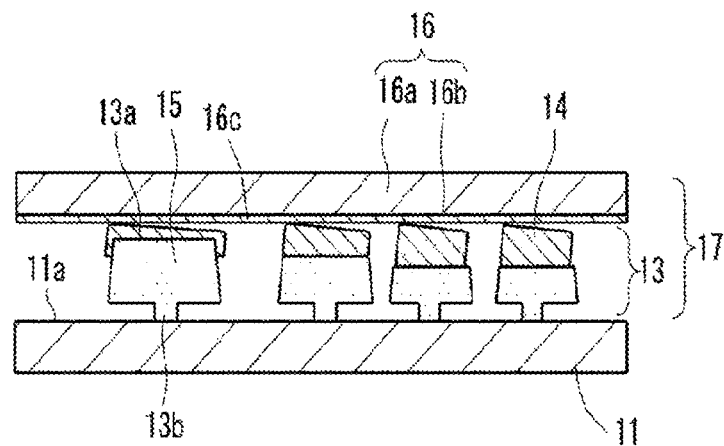
FIGS. 8A and 8B are each a cross-sectional view illustrating a bonding step according to the first embodiment.

FIG. 8 is a cross-sectional view illustrating a bonding step according to the first embodiment. As illustrated in FIG. 8A, with the bonding surface 16c facing the metal layer 14, the support substrate 16 is arranged on the metal layer 14 formed in the step of forming the metal layer 14 described above to bring the bonding surface 16c of the support substrate 16 and the upper surface 15a of the semiconductor elements 15 into contact with each other. Since the first surface 13a of the semiconductor element layer 13 is inclined as described above, the upper surface 15a of the semiconductor element 15, which is the upper surface of the metal layer 14 formed on the first surface 13a, is also inclined.

Figure 8B:
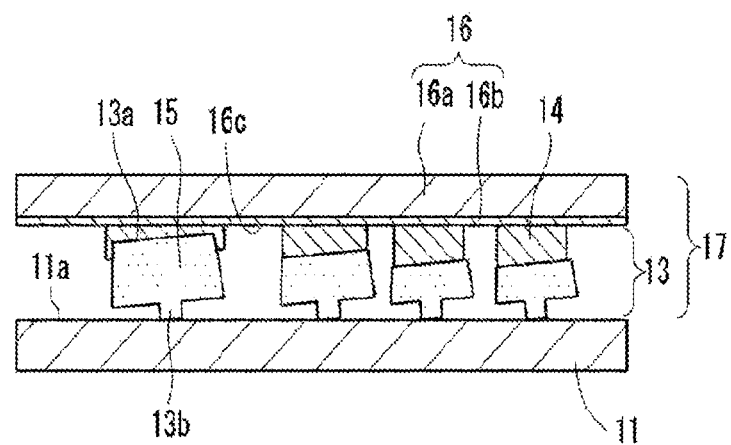

As illustrated in FIG. 8B, the support substrate 16 is pressed so that the metal layer 14 is pressed into close contact with the support substrate 16, and then the metal layer 14 is heated to 300° C. to perform AuSn bonding. However, bonding with the metal layer 14 is not limited to AuSn bonding. Various bonding methods that use other low-melting-point materials (e.g., such as AuIn, AuGe, InPd, or InSn) similar to AuSn can be used. Bonding may also be performed with a metal layer 14 that contains AuSn and/or AuCu having excellent thermal conductivity and that functions as a heat sink. At this time, the semiconductor elements 15 are displaced so that the entire surface of the upper surfaces 15a of the semiconductor elements 15 abuts against the bonding surface 16c. As a result, a large stress may be generated in the connecting portions 13b of the semiconductor element layer 13 and the connecting portions 13b may be broken.

Figure 9:
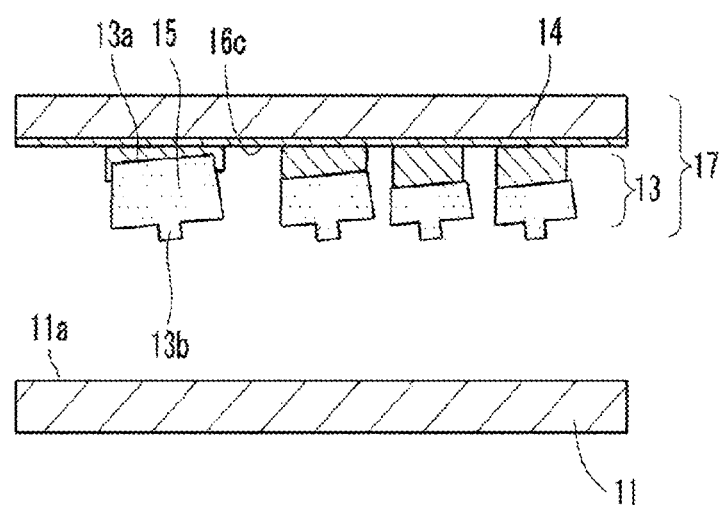
FIG. 9 is a cross-sectional view illustrating a peeling step according to the first embodiment.

FIG. 9 is a cross-sectional view illustrating a peeling step according to the first embodiment. After the underlying substrate 11, the support substrate 16, and the like are cooled by the substrate bonding apparatus or the like, the underlying substrate 11 and the support substrate 16 are taken out from the substrate bonding apparatus. At this time, the semiconductor element 15 is bonded onto the support substrate 16, and the connecting portions 13b are broken, so that the underlying substrate 11 can be easily peeled off. In the drawing, the connecting portions 13b having a columnar shape are attached to the semiconductor element layer 13. It is conceivable that the connecting portions 13b remain on the underlying substrate 11 side, on the semiconductor element 15 side, or on both sides, depending on the condition of breakage. Thus, after peeling, any connecting portions 13b remaining on the semiconductor elements 15 may be removed by polishing or the like.

In a semiconductor element body 17 bonded and peeled by the method described above, the first surface 13a of the semiconductor element layer 13 is parallel to the bonding surface 16c, which is a surface of the support substrate 16. On the other hand, the second surface 13c of the semiconductor element layer 13 is inclined with respect to the surface of the support substrate 16 in accordance with the inclination of the first surface 13a of the semiconductor element layer 13. Here, the first surface 13a of the semiconductor element layer 13 is considered to be parallel to the surface of the support substrate 16, when the inclination is, for example, less than 0.5°.

As described above, the semiconductor element body 17 of the first embodiment includes the support substrate 16, the first surface 13a, and the second surface 13c located on the opposite side to the first surface 13a, and the first surface 13a side is fixed to the support substrate 16. The semiconductor element body 17 includes the semiconductor element layer 13 in which the second surface 13c is inclined with respect to the surface of the support substrate 16. As a result, the semiconductor element layer 13 having excellent quality can be realized by the simple support structure.

As described above, since the semiconductor element 15 is formed with the upper surface 15a inclined with respect to the growth surfaces 11a of the underlying substrate 11, when being pressed in the bonding step S3, shearing stress is concentrated on the end portion of the connecting portions 13b having a columnar shape, and the connecting portions 13b are sheared. Accordingly, the semiconductor elements 15 can be separated from the underlying substrate 11 by simply being pressed, without separately applying a large force in a direction perpendicular to the surface of the underlying substrate 11 by ultrasonic waves or the like. As described above, the semiconductor elements 15 can be reliably transferred to the support substrate 16 without applying excessive force to the semiconductor elements 15, thereby improving the yield of the semiconductor elements 15.

Second Embodiment

Figure 10A:
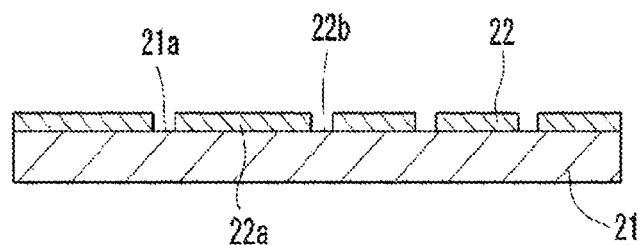
FIGS. 10A to 10C are each a cross-sectional view illustrating an element forming step for a semiconductor element body according to a second embodiment of the present disclosure.

FIG. 10 is a cross-sectional view illustrating an element forming step for a semiconductor element body according to a second embodiment of the present disclosure. As illustrated in FIG. 10A, first, an underlying substrate 21 is prepared. As the underlying substrate 21, as in the first embodiment, a GaN template substrate is used. However, a crystal plane of a growth surface 21a of the underlying substrate 21 has no off angle. A mask layer 22 is formed in a step similar to or the same as that in the first embodiment. The growth surfaces 21a are exposed through opening portions 22b of strip shape bodies 22a of the mask layer 22.

Figure 10B:
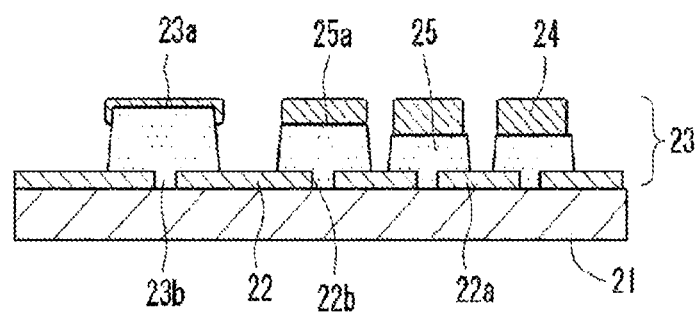

As illustrated in FIG. 10B, as in the first embodiment, a semiconductor element layer 23, which is a crystal growth layer of a nitride semiconductor, is vapor phase grown on the growth surfaces 20a exposed from the opening portions 22b of the strip shape bodies 22a. Thereafter, a metal layer 24 of a AuSn alloy or the like is formed on a first surface 23a of the semiconductor element layer 23.

Figure 10C:
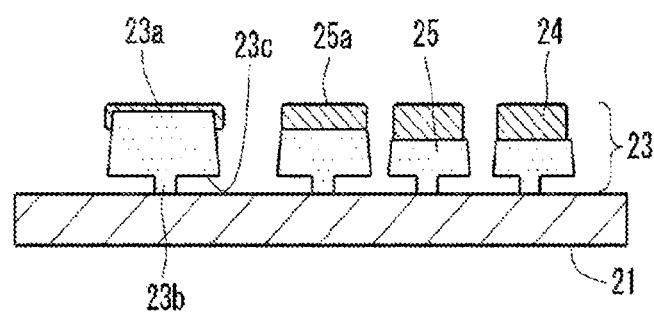

As illustrated in FIG. 10C, the mask layer 22 on the underlying substrate 21 is etched to form semiconductor elements 25 on the underlying substrate 21. The first surface 23a of the semiconductor element layer 23 and an upper surface 25a of the semiconductor element 25 are substantially parallel to the growth surface 21a of the underlying substrate 21. Also, in the second embodiment, similar to the first embodiment, the semiconductor element layer 23 has the first surface 23a and a second surface 23c located on the opposite side to the first surface 23a.

Third Embodiment

Figure 11:
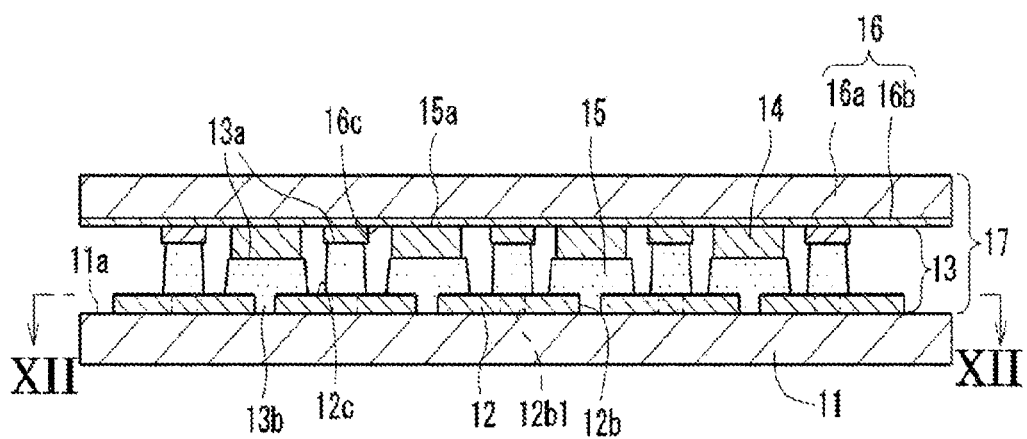
FIG. 11 is a cross-sectional view illustrating a configuration of a semiconductor element body according to a third embodiment of the present disclosure.
Figure 12:
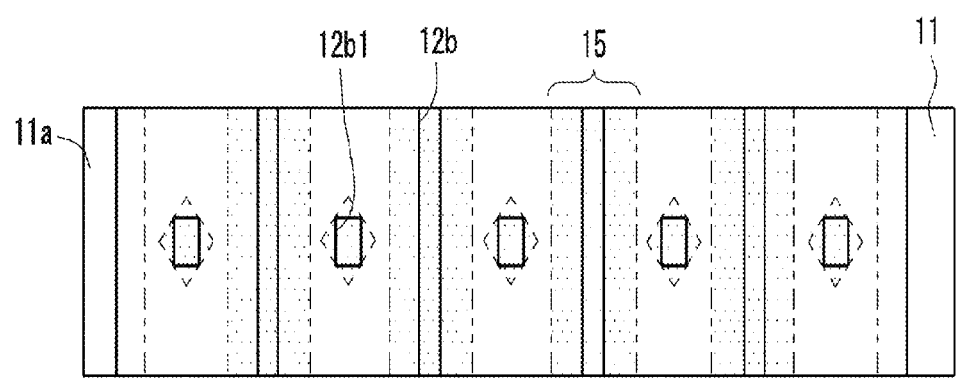
FIG. 12 is a cross-sectional view of the semiconductor element body as viewed from a cross-sectional plane line XII-XII in FIG. 11.

FIG. 11 is a cross-sectional view schematically illustrating a configuration of a semiconductor element body according to a third embodiment of the present disclosure. FIG. 12 is a cross-sectional view of the semiconductor element body as viewed from a cross-sectional plane line XII-XII in FIG. 11. The same reference signs are assigned to portions corresponding to those in the above-described embodiments, and description thereof will not be repeated. In the above-described embodiments, configurations in which the opening portions 12b extend in parallel in a stripe shape has been described. In other embodiments of the present disclosure, at a portion where the semiconductor element layer 13 to be used as a spacer of the support substrate 16 relative to the underlying substrate 11 is formed, opening portions 12b1 may be formed spaced apart at constant intervals in the <1-100> direction (e.g., the vertical direction in FIG. 12). According to the opening portions 12b1 such as those described above, the semiconductor element layer 13 described above that serves as a sacrificial layer need not be fabricated, and unwanted semiconductor crystals are not grown. Thus, improved productivity can be had.

As described above, in the present disclosure, a method for manufacturing a semiconductor device includes: a mask layer forming step of forming a mask layer on an underlying substrate, the mask layer including a first mask portion in which two opening portions adjacent to each other are located spaced apart by a predetermined first interval and a second mask portion in which two opening portions adjacent to each other are located spaced apart by a predetermined second interval larger than the first interval; an element forming step of forming a semiconductor element by growing a semiconductor layer on the mask layer; a preparing step of preparing a support substrate including a bonding surface, the bonding surface facing the underlying substrate; a bonding step of bonding together an upper surface of the semiconductor element and the bonding surface of the support substrate; and a peeling step of peeling the semiconductor element formed on the mask layer from the underlying substrate.

When spacers are used in forming a GaN semiconductor layer by epitaxial vapor phase growth, the variation in height of the GaN semiconductor layer has an in-plane distribution. Thus, when spacers having the same height are used in the entire plane, the amount of protrusion of the bonding layer from the GaN semiconductor layer varies depending on the location. In a case where the amount of protrusion of the bonding layer is large, for example, when the semiconductor elements constructed of the GaN semiconductor layer are semiconductor lasers, an emission end surface of the semiconductor elements may be covered by the protruding portion of the bonding layer, and thus the manufacturing yield may decrease. Thus, a method for manufacturing a semiconductor element and a semiconductor element body with which the manufacturing yield can be improved are desired.

According to the method for manufacturing a semiconductor element according to the present disclosure, for the mask layer on the underlying substrate, the growth rate of the semiconductor element layer is faster and thus the thickness of the semiconductor element layer can be made larger in the second mask portion of which the interval is larger than that of the first mask portion. As a result, the amount of protrusion of the metal layer between the upper surface of the semiconductor element layer and the bonding surface of the support substrate can be kept constant, thereby improving manufacturing yield.

Fourth Embodiment

Figure 13:
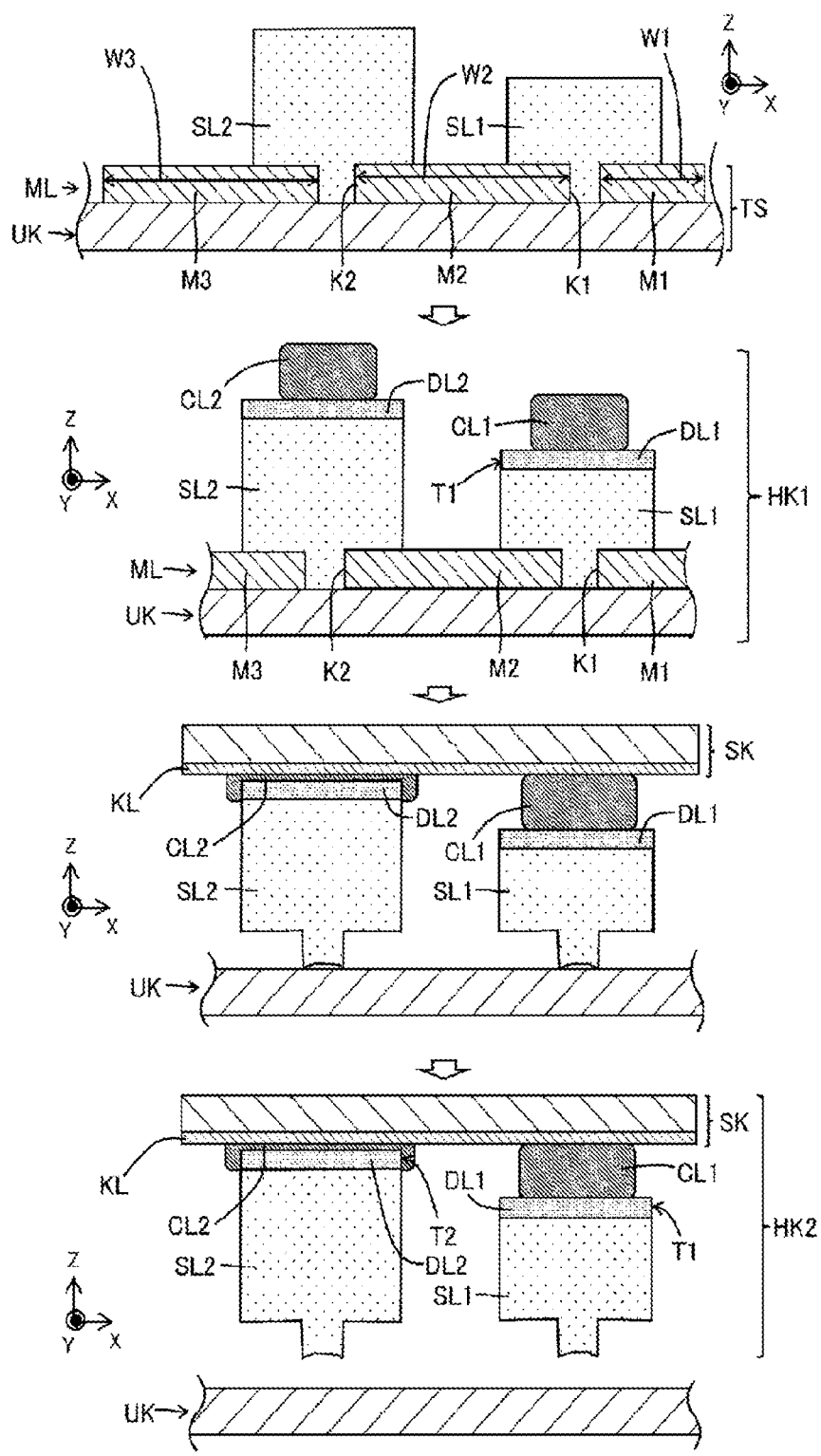
FIG. 13 is a cross-sectional view illustrating a method for manufacturing a semiconductor element according to a fourth embodiment.
Figure 14:
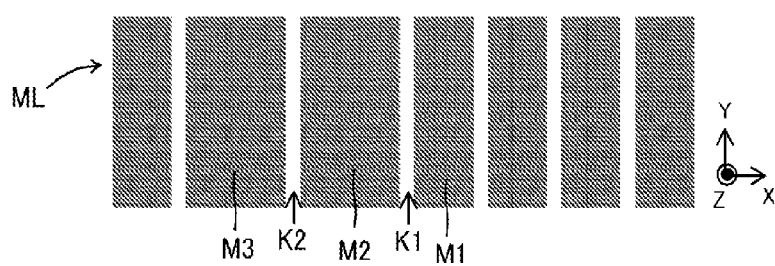
FIG. 14 is a plan view illustrating a configuration example of a mask layer according to the fourth embodiment.

FIG. 13 is a cross-sectional view illustrating a method for manufacturing a semiconductor element according to a fourth embodiment. FIG. 14 is a plan view illustrating a configuration example of a mask layer according to the fourth embodiment. As illustrated in FIGS. 13 and 14, the method for manufacturing a semiconductor element according to the fourth embodiment includes: a step of preparing an underlying substrate UK on a surface of which a mask layer ML is disposed, the mask layer ML including a first opening portion K1 and a second opening portion K2 adjacent to each other in a first direction (X direction); a step of forming, on the underlying substrate UK, a first semiconductor layer SL1 overlapping the first opening portion K1 in plan view using, for example, an ELO method; and a step of forming, on the underlying substrate UK, a second semiconductor layer SL2 overlapping the second opening portion K2 in plan view and being larger in thickness than the first semiconductor layer SL1 using, for example, an ELO method. The first and second semiconductor layers SL1 and SL2 may be formed by the same film forming process (for example, an ELO process).

The mask layer ML includes: a first mask portion M1; a second mask portion M2 that is adjacent to the first mask portion M1 via the first opening portion K1 and that is wider than the first mask portion M1 (W1<W2); and a third mask portion M3 adjacent to the second mask portion M2 via the second opening portion K2. The first and second opening portions K1 and K2 are slit-shaped, in which the Y direction (second direction) orthogonal to the X direction is the longitudinal direction. A substrate including the underlying substrate UK and the mask layer ML is sometimes referred to as a template substrate TS. The underlying substrate UK and the first and second semiconductor layers SL1 and SL2 each contain, for example, a nitride semiconductor. The first and second opening portions K1 and K2 expose the upper surface (seed portion) of the underlying substrate UK, and function as growth start holes that cause the growth of the first and second semiconductor layers SL1 and SL2 to start. The mask portions M1 to M3 function as selective growth masks that cause the first and second semiconductor layers SL1 and SL2 to laterally grow. A mask portion and an opening portion refer to a portion with a mask body and a portion without a mask body, respectively, regardless of whether the mask portion is layered. Each of the opening portions need not be entirely surrounded by the mask portion.

The width direction in FIGS. 13 and 14 is the X direction. For example, the width W3 of the third mask portion M3 is equal to the width W2 of the second mask portion M2, and the width of the first opening portion K1 and the width of the second opening portion K2 are equal to each other. In this step, the thickness of the second semiconductor layer SL2 supplied with more raw material becomes larger than the thickness of the first semiconductor layer SL1. Periodically arranging the combined configuration of the first and second semiconductor layers SL1 and SL2 in the plane causes the second semiconductor layer SL2 to have a large thickness in the region where the first semiconductor layer SL1 has a large thickness, and causes the second semiconductor layer SL2 to have a small thickness in the region where the first semiconductor layer SL1 has a small thickness. Thus, the difference in thickness (height difference) between the first and second semiconductor layers SL1 and SL2 is made uniform in a plane. Note that the width (the length in the X direction) of the second semiconductor layer SL2 may be larger than the width of the first semiconductor layer SL1.

After the first and second semiconductor layers SL1 and SL2 are formed, the step of forming a first device layer DL1 on the first semiconductor layer SL1 and the step of forming a second device layer DL2 on the second semiconductor layer SL2 are performed. As a result, a semiconductor element substrate HK1 is formed. The first and second device layers DL1 and DL2 may be formed in the same film forming process. Each of the first and second device layers DL1 and DL2 can include an n-type semiconductor layer, an active layer, and a p-type semiconductor layer.

After the first and second device layers DL1 and DL2 are formed, the step of forming a first metal layer CL1 on the first device DL1 and the step of forming a second metal layer CL2 on the second device layer DL2 are performed. The first and second metal layers CL1 and CL2 may be formed in the same film forming process. For example, since the thickness of the first device layer DL1 and the thickness of the second device layer DL2 are approximately the same, the position of the upper surface of the second metal layer CL2 is located higher than the upper surface of the first metal layer CL1.

After the first and second metal layers CL1 and CL2 are formed, the step of bonding the first and second device layers DL1 and DL2 to a support substrate SK via the first and second metal layers CL1 and CL2 is performed, with the first and second metal layers CL1 and CL2 in a melted state, by bringing the first and second metal layers CL1 and CL2 into contact with the support substrate SK and then curing the first and second metal layers CL1 and CL2. When bonding, the second semiconductor layer SL2 and the second device layer DL2 function as a spacer, and the second metal layer CL2 becomes thinner than the first metal layer CL1.

The second metal layer CL2 may come into contact with an end surface of the second device layer DL2 (a surface having a normal line parallel to the X direction or the Y direction). The second metal layer CL2 enhances the strength of bonding with the support substrate SK. Note that an emission surface of a laser beam may be included in an end surface of the first device layer DL1 (e.g., a surface having a normal line parallel to the Y direction). As described above, the difference in thickness (height difference) between the first and second semiconductor layers SL1 and SL2 is made uniform in a plane, and thus the risk of the first metal layer CL1 coming into contact with an end surface of the first device layer DL1 is reduced. The second semiconductor layer SL2 and the second device layer DL2 can be sacrificial layers (not used as a semiconductor layer element). However, the present disclosure is not limited thereto. In some cases, the second semiconductor layer SL2 and the second device layer DL2 can be used as a semiconductor element depending on the configuration of the second device layer DL2.

When the first and second device layers DL1 and DL2 are bonded to the support substrate SK, stress is applied to the first and second semiconductor layers SL1 and SL2, and thus the bonding force between the underlying substrate UK and the first and second semiconductor layers SL1 and SL2 that are fixed together is weakened (e.g., the bonding portion is broken).

The first and second metal layers CL1 and CL2 may be bonded to a third metal layer KL located on the support substrate SK. The first metal layer CL1 may be an electrode (anode or cathode) on the first device layer DL1.

For example, when the first and second device layers DL1 and DL2 and the support substrate SK are bonded together, the respective upper surfaces of the first and second metal layers CL1 and CL2 may be inclined relative to the support substrate SK by approximately from 0.05° to 5°. This inclination is due to the off angle of the underlying substrate UK, for example. Thus, when the first and second device layers DL1 and DL2 are bonded to the support substrate SK, the first and second semiconductor layers SL1 and SL2 are effectively subjected to upward stress.

After the support substrate SK is bonded, the step of separating the first and second semiconductor layers SL1 and SL2 from the underlying substrate UK is performed. As a result, a semiconductor element substrate HK2 is formed. Before the first and second semiconductor layers SL1 and SL2 are separated, the mask layer ML (first to third mask portions M1 to M3) may be removed by etching or the like. The mask layer ML and the first and second semiconductor layers SL1 and SL2 may adhere to each other by Van der Waals' forces or mutual diffusion of constituent elements. Thus, removing the mask layer ML can easily separate the first and second semiconductor layers SL1 and SL2. Note that in the present disclosure, the support substrate SK is bonded before the mask layer ML is removed.

Note that the mask layer ML (first to third mask portions M1 to M3) may be removed by etching or the like before the support substrate SK is bonded. Since the mask layer ML is exposed on the surface prior to bonding, the mask layer ML on the entire surface of the semiconductor element substrate can be easily removed by wet etching. Before the first and second semiconductor layers SL1 and SL2 are separated, the first semiconductor layer SL1 and the first device layer DL1 may be divided into a plurality of semiconductor element portions aligned in the Y direction.

Figure 15:
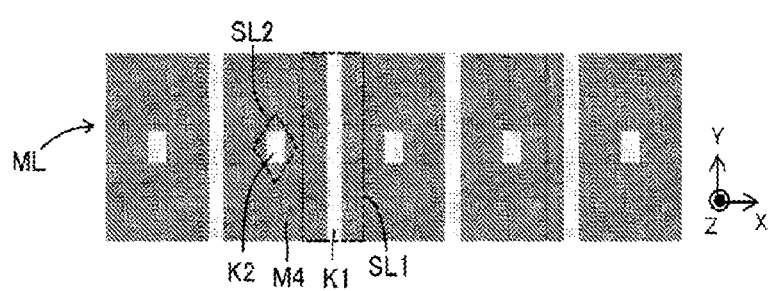
FIG. 15 is a plan view illustrating another configuration of the mask layer according to the fourth embodiment.

FIG. 15 is a plan view illustrating another configuration of the mask layer according to the fourth embodiment. The mask layer ML is not limited to that in FIG. 14. For example, as in FIG. 15, a configuration may be employed in which the length in the Y direction orthogonal to the first direction (X direction) of the second opening portion K2 is smaller than the length of the first opening portion K1. The second opening portion K2 is formed in, for example, a mask portion M4 adjacent to a slit-shaped first opening portion K1. For example, the respective widths of the first and second opening portions K1 and K2 are equal to each other.

In this case, the thickness of the second semiconductor layer SL2 grown on the second opening portion K2 (which grows faster in the Z direction than in the X direction) is larger than the thickness of the first semiconductor layer SL1. In a region where the thickness of the first semiconductor layer SL1 is large, the thickness of the second semiconductor layer SL2 is also large. In a region where the thickness of the first semiconductor layer SL1 is small, the thickness of the second semiconductor layer SL2 is also small. Thus, the difference in thickness (height difference) between the first and second semiconductor layers SL1 and SL2 is made uniform in a plane. In FIG. 15, the width (the length in the X direction) of the second semiconductor layer SL2 is smaller than the width of the first semiconductor layer SL1.

In the fourth embodiment, a configuration may be employed in which the underlying substrate UK contains a nitride semiconductor (such as a GaN-based semiconductor, AlN, InN, AlInN, or BN), and the first and second semiconductor layers SL1 and SL2 each contain a nitride semiconductor, for example, a GaN-based semiconductor (such as GaN, AlGaN, InGaN, or AlInGaN). In this case, the thickness direction (Z direction) of the first and second semiconductor layers SL1 and SL2 can be the <0001> direction (c-axis direction) of the nitride semiconductor, the first direction (X direction) in which the first and second opening portions K1 and K2 are aligned can be the <11-20> direction (a-axis direction) of the nitride semiconductor, and the Y direction can be the <1-100> direction (m-axis direction) of the nitride semiconductor.

Figure 16:
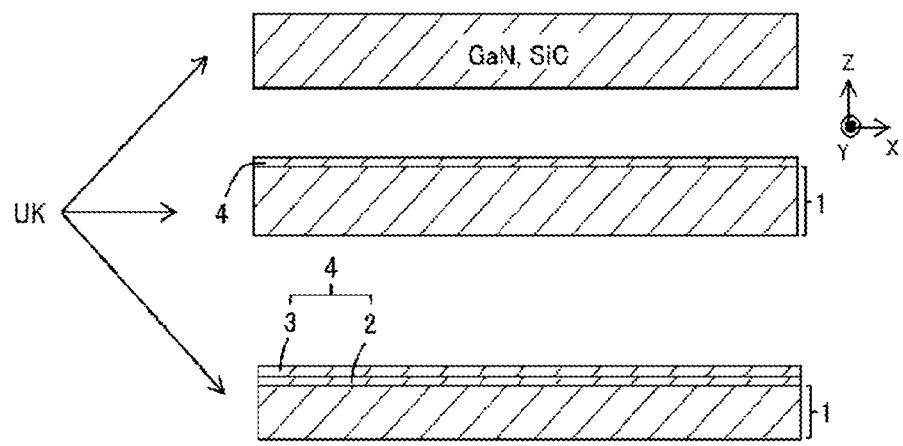
FIG. 16 is a cross-sectional view illustrating a configuration example of an underlying substrate according to the fourth embodiment.

FIG. 16 is a cross-sectional view illustrating a configuration example of an underlying substrate according to the fourth embodiment. The underlying substrate UK may be a GaN wafer cut out from a bulk crystal of GaN, or may be a SiC wafer (hexagonal 6H-SiC or 4H-SiC) cut out from a bulk crystal of SiC. An off angle may be added when the underlying substrate UK is cut out from the bulk crystal.

A configuration may be employed in which the underlying substrate UK includes a dissimilar substrate 1 having a lattice constant different from that of the GaN-based semiconductor, and an underlying layer 4 (seed layer) formed on the dissimilar substrate 1. In this case, the dissimilar substrate 1 may be a silicon substrate, and the underlying layer 4 may be AlN or a silicon carbide (6H-SiC or 4H-SiC). Alternatively, the dissimilar substrate 1 may be a silicon carbide substrate, and the underlying layer 4 may be a GaN-based semiconductor or AlN.

A configuration may be employed in which the underlying substrate UK includes the dissimilar substrate 1 and the underlying layer 4 formed on the dissimilar substrate 1, and the underlying layer 4 includes a buffer layer 2 on the lower layer side and a seed layer 3 formed on the buffer layer 2. In this case, a configuration may be employed in which the dissimilar substrate 1 is a silicon substrate, the buffer layer 2 contains AlN and/or a silicon carbide, and the seed layer 3 is a GaN-based semiconductor. A boron nitride (BN) may be used for the buffer layer 2, and AlN may be used for the seed layer 3. The upper surface of the dissimilar substrate 1 in FIG. 16 may have an off angle.

The semiconductor element substrate HK1 in FIG. 13 includes a first semiconductor layer SL1 containing a nitride semiconductor, a first device layer DL1 overlapping the first semiconductor layer SL1 in plan view, a first metal layer CL1 disposed on the first device layer DL1, a second semiconductor layer SL2 containing a nitride semiconductor, a second device layer DL2 overlapping the second semiconductor layer SL2 in plan view, and a second metal layer CL2 disposed on the second device layer DL2. The thickness of the second semiconductor layer SL2 is larger than the thickness of the first semiconductor layer SL1.

The semiconductor element substrate HK1 includes an underlying substrate UK connected to the first and second semiconductor layers SL1 and SL2. The first and second device layers DL1 and DL2 each contain a nitride semiconductor (e.g., a GaN-based semiconductor). The first and second semiconductor layers SL1 and SL2 may contain the same nitride semiconductor (e.g., GaN). Since the first and second device layers DL1 and DL2 have approximately the same thickness, the upper surface of the second metal layer CL2 is located higher than the upper surface of the first metal layer CL1. The semiconductor element substrate HK1 is provided with a mask layer ML that is in contact with the underlying substrate UK and the first and second semiconductor layers SL1 and SL2.

The semiconductor element substrate HK2 in FIG. 13 includes a first semiconductor layer SL1 containing a nitride semiconductor, a first device layer DL1 overlapping the first semiconductor layer SL1 in plan view, a first metal layer CL1 disposed on the first device layer DL1, a second semiconductor layer SL2 containing a nitride semiconductor, a second device layer DL2 overlapping the second semiconductor layer SL2 in plan view, and a second metal layer CL2 disposed on the second device layer DL2. The thickness of the second semiconductor layer SL2 is larger than the thickness of the first semiconductor layer SL1.

The semiconductor element substrate HK2 includes a support substrate SK bonded to the first and second device layers DL1 and DL2 via the first and second metal layers CL1 and CL2. The first and second device layers DL1 and DL2 each contain a nitride semiconductor (e.g., a GaN-based semiconductor). The first and second semiconductor layers SL1 and SL2 may contain the same nitride semiconductor (e.g., GaN).

In the semiconductor element substrate HK2, the thickness of the second metal layer CL2 can be smaller than the thickness of the first metal layer CL1. The second metal layer CL2 may come into contact with an end surface T2 of the second device layer DL2. A configuration may be employed in which the first device layer DL1 has a light-emitting function, and the second device layer DL2 is a sacrificial layer (has no light-emitting function). A configuration may be employed in which the third metal layer KL is located on the support substrate SK, and the first and second metal layers CL1 and CL2 are bonded to the third metal layer KL. The support substrate SK may be a mounting substrate (a drive substrate for a thin-film transistor (TFT) substrate or the like).

In the semiconductor element substrates HK1 and HK2, the first and second semiconductor layers SL1 and SL2 may be aligned in the <11-20> direction (X direction) of the nitride semiconductor. The first semiconductor layer SL1 and the first device layer DL1 may constitute a semiconductor element portion (e.g., a light-emitting element portion). An emission surface of a laser beam may be included in an end surface T1 of the first device layer DU. The first metal layer CL1 may function as an electrode, for example an anode.

Figure 17:
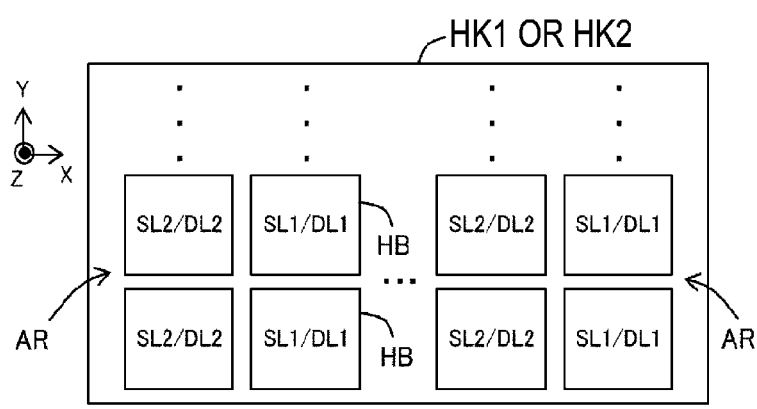
FIG. 17 is a plan view illustrating a configuration example of a semiconductor element substrate according to the fourth embodiment.

FIG. 17 is a plan view illustrating a configuration example of a semiconductor element substrate according to the fourth embodiment. As illustrated in FIG. 17, a configuration may be employed in which the semiconductor element substrates HK1 and HK2 include a plurality of regions AR, and each of the regions AR is provided with the first semiconductor layer SL1 and the first device layer DL1 as well as the second semiconductor layer SL2 and the second device layer DL2. The semiconductor element substrates HK1 and HK2 may include a plurality of semiconductor element portions HB (each including the first semiconductor layer SL1 and the first device layer DL1). The plurality of semiconductor element portions HB may be aligned in the X direction and/or the Y direction.

The present disclosure has been described in detail above. However, the present disclosure is not limited to the embodiments described above, and various modifications or improvements can be made without departing from the essential spirit of the present disclosure

REFERENCE SIGNS

11 Underlying substrate
13 Semiconductor element layer
13a First surface
13b Connecting portion
13c Second surface
14 Metal layer
15 Semiconductor element
15a Upper surface
16 Support substrate
16c Bonding surface
17 Semiconductor element body
S1 Mask layer forming step
S2 Element forming step
S3 Preparing step
S4 Bonding step
S5 Peeling step

The invention claimed is:

1. A method for manufacturing a semiconductor element substrate, the method comprising:
preparing a semiconductor substrate including:
an underlying substrate on a surface of which a mask layer is disposed, the mask layer including a first opening portion and a second opening portion adjacent to each other in a first direction,
a first semiconductor layer overlapping the first opening portion in plan view,
a second semiconductor layer overlapping the second opening portion in plan view and being larger in thickness than the first semiconductor layer,
a first device layer overlapping the first semiconductor layer in plan view,
a first metal layer disposed on the first device layer,
a second device layer overlapping the second semiconductor layer in plan view, and
a second metal layer disposed on the second device layer,
wherein a surface of the second metal layer facing the underlying substrate is located higher than a surface of the first metal layer facing the underlying substrate; and
bonding the first and second device layers to a support substrate.

2. The method for manufacturing a semiconductor element substrate according to claim 1, wherein the mask layer comprises:
a first mask portion;
a second mask portion that is adjacent to the first mask portion via the first opening portion and that is wider than the first mask portion; and
a third mask portion adjacent to the second mask portion via the second opening portion.

3. The method for manufacturing a semiconductor element substrate according to claim 1, wherein, in the mask layer, a length in a direction orthogonal to a first direction of the second opening portion is smaller than a length of the first opening portion.

4. The method for manufacturing a semiconductor element substrate according to claim 1, further comprising:
forming a first device layer and a second device layer respectively on the first semiconductor layer and the second semiconductor layer;
forming a first metal layer on the first device layer; and
forming a second metal layer on the second device layer;
wherein with the first and second metal layers in a melted state, the first and second metal layers are brought into contact with the support substrate to bond the first and second device layers to the support substrate via the first and second metal layers.

5. The method for manufacturing a semiconductor element substrate according to claim 4, wherein a bonding force between the first and second semiconductor layers and the underlying substrate is weakened when the first and second device layers are bonded to the support substrate.

6. The method for manufacturing a semiconductor element substrate according to claim 4, wherein after the first and second device layers and the support substrate are bonded together, the second metal layer is thinner than the first metal layer.

7. The method for manufacturing a semiconductor element substrate according to claim 4, wherein when the first and second device layers and the support substrate are bonded together, the second semiconductor layer and a second device layer function as a spacer.

8. The method for manufacturing a semiconductor element substrate according to claim 4, wherein the first metal layer functions as an electrode on the first device layer.

9. The method for manufacturing a semiconductor element substrate according to claim 4, wherein the first and second metal layers are bonded to a third metal layer located on the support substrate.

10. The method for manufacturing a semiconductor element substrate according to claim 4, wherein an upper surface of the first device layer and an upper surface of the second device layer are inclined relative to the support substrate.

11. The method for manufacturing a semiconductor element substrate according to claim 1, further comprising:

forming a first device layer and a second device layer respectively on the first semiconductor layer and the second semiconductor layer; and after the first and second device layers are bonded to the support substrate, separating the first and second semiconductor layers from the underlying substrate.

12. The method for manufacturing a semiconductor element substrate according to claim 11, further comprising:

removing the mask layer before the first and second semiconductor layers are separated from the underlying substrate.

13. The method for manufacturing a semiconductor element substrate according to claim 11, further comprising:

dividing the first semiconductor layer and the first device layer into a plurality of semiconductor element portions before the first and second semiconductor layers are separated from the underlying substrate.

14. The method for manufacturing a semiconductor element substrate according to claim 1, wherein the first and second semiconductor layers each contain a nitride semiconductor.

15. A semiconductor element substrate comprising:

a first semiconductor layer;

a second semiconductor layer located to be separated from the first semiconductor layer; and an underlying substrate connected to the first and second semiconductor layers;

wherein the first and second semiconductor layers each contain a nitride semiconductor and wherein a thickness of the second semiconductor layer is larger than a thickness of the first semiconductor layer, a first device layer overlapping the first semiconductor layer in plan view;

a first metal layer disposed on the first device layer;

a second device layer overlapping the second semiconductor layer in plan view; and a second metal layer disposed on the second device layer;

wherein a surface of the second metal layer facing the underlying substrate is located higher than a surface of the first metal layer facing the underlying substrate.

* * * * *